United States Patent [19]

Hartman et al.

[11] Patent Number: 4,587,656
[45] Date of Patent: May 6, 1986

[54] HIGH VOLTAGE SOLID-STATE SWITCH

[75] Inventors: Adrian R. Hartman, New Providence, N.J.; Terence J. Riley, Wyomissing, Pa.; Peter W. Shackle, West Melborne, Fla.

[73] Assignee: AT&T Bell Laboratories, Murray Hill, N.J.

[21] Appl. No.: 248,207

[22] Filed: Mar. 27, 1981

Related U.S. Application Data

[63] Continuation-in-part of Ser. No. 107,775, Dec. 28, 1979.

[51] Int. Cl.$^4$ .............................................. H01L 29/72
[52] U.S. Cl. ........................................ 357/38; 357/21; 357/22; 357/39; 357/41; 357/49
[58] Field of Search ..................... 357/22, 21, 38, 39, 357/41, 49

[56] References Cited

U.S. PATENT DOCUMENTS 4,060,821  11/1977  Houston et al. ..................... 357/22

FOREIGN PATENT DOCUMENTS 2102103  7/1971  Fed. Rep. of Germany ........ 357/22
2433981  3/1975  Fed. Rep. of Germany ........ 357/22

OTHER PUBLICATIONS

A MOS-Controlled Triac Device—Scharf et al—pp. 222–223, 1978, IEEE International Solid-State Circuits Conference.

Primary Examiner—Edward J. Wojciechowicz
Attorney, Agent, or Firm—David I. Caplan

[57] ABSTRACT

A high voltage solid-state switch, which provides bidirectional blocking, consists of a first n type semiconductor body separated from a support member (semiconductor substrate) by a dielectric layer with a p+ type anode region located at one end of the semiconductor body, an n+ type cathode region located at the other end, and an n+ type gate region located between the anode and cathode regions. A second p type region of lower impurity concentration than the anode region surrounds the cathode region so as to separate it from the bulk portion of the semiconductor body. Separate low resistance electrical contacts are made to the anode, cathode, and gate regions and to the substrate. The switch is capable of switching from an "ON" and conducting state to an "OFF" (blocking) state by adjusting the potential of the gate region and without having to adjust the potential of the anode or cathode regions.

4 Claims, 2 Drawing Figures

HIGH VOLTAGE SOLID-STATE SWITCH

CROSS-REFERENCE TO RELATED APPLICATION

This application is a continuation-in-part of our co-pending application Ser. No. 107,775, filed Dec. 28, 1979.

TECHNICAL FIELD

This invention relates to solid-state structures and, in particular, to high voltage solid-state structures useful in telephone switching systems and many other applications.

BACKGROUND OF THE INVENTION

In an article entitled "Development of Integrated Semiconductor Crosspoint Switches and a Fully Electronic Switching System" by Michio Tokunaga et al, *International Switching Symposium,* Oct. 26, 1976, at Kyoto, Japan, Paper 221-4, there is illustrated a dielectrically isolated all solid-state high voltage switch having an n type bulk semiconductor body. A p+ type conductivity anode region is separated from a p+ type conductivity first gate region only by portions of the bulk of the body. The first gate region surrounds and contacts an n+ type conductivity cathode region. A second n+ type conductivity gate region exists in the semiconductor body and is located in a portion of the semiconductor body other than directly between the anode and first gate regions. The switch is turned on by injecting or extracting current from one of the gate regions. Once current flow between anode and cathode ceases, then the switch reverts to its normally off blocking state. One deficiency of this structure is that it is unable conveniently to interrupt existing substantial current flow between anode and cathode (the output terminals).

It is desirable to have an all solid-state switch much like the one described hereinabove, but in which it is possible to readily interrupt (cut off) existing substantial current flow between the output terminals thereof without having to change the potentials of the output terminals.

SUMMARY OF THE INVENTION

One embodiment of the present invention is a structure comprising a semiconductor body whose bulk is of one conductivity type and which has a major surface. Within the semiconductor body are localized first and fourth regions which are of the opposite conductivity type, and localized second and third regions which are of the one conductivity type. The first, second, and third regions are spaced apart from each other, have separate electrode connections thereto, and are of relatively low resistivity compared to the bulk of the semiconductor body. The fourth region is of higher resistivity than the first region and lower resistivity than the semiconductor body and surrounds the third region so as to separate it from the bulk portion of the semiconductor body. Each of the four regions has a portion which forms part of the major surface of the semiconductor body. The second region is located essentially directly between the first and fourth regions. The structure is adapted to selectivity facilitate substantial current flow between the first and third regions or to divert a sufficient portion of current flow into the second region so as to interrupt (cut off) said current flow between the first and third regions. It is further adapted to selectivity inhibit substantial current from flowing between the first and third regions. The structure is still further adapted such that selectively during operation there is a dual carrier injection. The overall geometry and impurity concentrations of the structure have been selected so as to aid in the inhibiting or interrupting of current flow between the first and third regions.

In a preferred embodiment the semiconductor body is of n type conductivity and is isolated from a semiconductor support by a dielectric layer and a plurality of said bodies are formed in said support and are separated from each other by at least a dielectric layer. Ihe first, second, and third regions serve as the anode, gate, and cathode, respectively, of the structure.

The structure of the present invention, when suitably designed, can be operated as a switch that is characterized by a low impedance path between anode and cathode when in the ON state and a high impedance path between anode and cathode when in the OFF (blocking) state. The potential applied to the gate region determines the state of the switch. In a preferred embodiment the semiconductor support is biased at the most positive potential used with the structure when the semiconductor body is of p− type conductivity and at the most negative potential when it is of n− type conductivity. The biased semiconductor support member serves to aid in establishing the OFF state. There is no need to adjust the potentials of the anode or the cathode to cause the switch to assume the OFF state. The switch inhibits or interrupts (cuts off) conduction between the anode and cathode when it is set to the OFF state. During the ON state, with appropriate potentials applied to the anode and cathode, there is dual carrier injection that results in the resistance between anode and cathode being relatively low.

This structure, when suitably designed, is capable in the OFF state of blocking relatively large potential differences between anode and cathode regions, independent of polarity, and is capable in the ON state of conducting relatively large amounts of current with a relatively low voltage drop between anode and cathode.

Arrays of these GDSs can be fabricated on a single integrated circuit chip together with other high voltage circuit components. The bilateral blocking characteristic of the structure facilitates its use in a bidirectional switch formed by two of the structures of the present invention with the cathode of each coupled to the anode of the other and the gates being coupled together.

These and other novel features and advantages of the present invention are better understood from consideration of the following detailed description taken in conjunction with the accompanying drawings.

DETAILED DESCRIPTION

Figure 1:
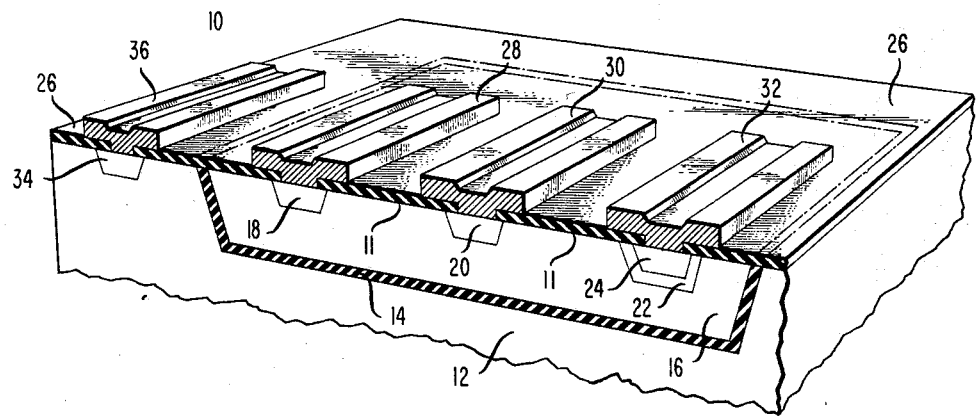
FIG. 1 illustrates a structure in accordance with the preferred embodiment of the invention.

Referring new to FIG. 1, there is illustrated a perspective view of a structure 10 having a planar surface 11 and comprising a support member 12 supporting a semiconductor body 16 whose bulk is of n type conductivity, and which is separated from support member 12 by an insulator layer 14 which is typically a dielectric layer.

A localized first anode region 18, which is of the p+ type conductivity, is included in body 16 and has a portion thereof that forms a part of surface 11. A localized second gate region 20, which is of n+ type conductivity, is also included in body 16 and has a portion thereof which forms a part of surface 11. A localized third cathode region 24, which is of the n+ type conductivity, is included in body 16 and has a portion which forms a part of surface 11. A region 22, which is of p type conductivity, surrounds region 24 and acts as a depletion layer punch-through shield and aids in switching off the structure. In addition it acts to inhibit inversion of the portions of body 16 at or near surface 11 between regions 20 and 24 and to increase the voltage blocking capability between region 20 and 24. Gate region 20 is located essentially directly between anode region 18 and region 22 and is separated from both by n− type bulk portions of body 16. The resistivities of regions 18, 20, and 24 are low compared to that of the bulk portions of body 16. The resistivity of region 22 is intermediate between that of cathode region 24 and that of intermediate between that of cathode region 24 and that of the bulk portions of body 16.

Electrodes 28, 30, and 32 are conductors which make low resistance contact to the surface portions of regions 18, 20, and 24, respectively. An apertured dielectric layer covers major surface 11 so as to isolate electrodes 28, 30, and 32 from all regions other than those intended to be electrically contacted. An electrode 36 provides a low resistance contact to support 12 by way of a highly doped (low resistivity) localized semiconductor region 34 which is of the same type conductivity type as support 12.

Advantageously, the support 12 and the body 16 are each of silicon with the support 12 either of n or of p type conductivity. As shown, electrodes 28, 30, and 32 advantageously overlap the semiconductor regions to which they make low resistance contact although electrically isolated therefrom by portions of layer 26. Electrode 32 also completely overlaps region 22. This overlapping, which is known as field plating, facilitates high voltage operation because it increases the voltage at which breakdown occurs.

In the illustrative embodiment, support 12 and body 16 and regions 18, 20, 22, 24, and 34 are all silicon and are of n−, n−, p+, n+, p, n+, and n+ type conductivity respectively, where the "+" designates relatively low resistivity and "−" designates relatively high resistivity. Dielectric layer 14 is silicon dioxide and electrodes 28, 30, 32, and 36 are all aluminum layers.

A plurality of separate bodies 16 can be formed in a common support 12 to provide in one integrated structure a plurality of switches.

Structure 10 is typically operated as a switch which is characterized by a low impedance path between anode region 18 and cathode region 24 when in the ON state and as a high impedance between said two regions when in the OFF (blocking) state. Substrate 12 is typically held at the most positive potential level available when body 16 is of n− type conductivity. It is held at the most negative potential level available when body 16 is of p− type conductivity. With forward bias operating potentials applied to the regions 18 and 24, the potential applied to gate region 20 determines the state of the switch. Regions 18 and 24 serve as the anode and cathode regions, respectively, when semiconductor body 16 is of n− type conductivity. Regions 18 and 24 serve as the cathode and anode regions, respectively, when semiconductor body 16 is of p− type conductivity.

With body 16 being of n− type conductivity, conduction between anode region 18 and cathode region 24 is inhibited or interrupted (cut off) if the potential of gate region 20 is sufficiently more positive than that of anode region 18, cathode region 24, and region 22. The amount of excess positive potential needed to inhibit or interrupt (cut off) conduction is a function of the geometry and impurity concentration (doping) levels of structure 10. This positive gate potential causes a vertical cross-sectional portion of body 16 between gate region 20 and the portion of dielectric layer 14 therebelow to be depleted and the potential of this portion of body 16 to be greater in magnitude than that of anode region 18, cathode region 24, and region 22. This positive potenital barrier inhibits the conduction of holes from anode region 18 to cathode region 24 and region 22. In addition, depletion regions are formed at the junctions of anode region 18 and body 16 and at region 22 and body 16. The electric field within the formed depletion regions serves to retain holes within anode region 18 and region 22 and thus limits current flow between anode region 18 and cathode region 22. It essentially pinches off body 16 against dielectric layer 14 in the bulk portion thereof between anode region 18 and region 22 and extending down to dielectric layer 14. If conduction exists between anode region 18 and cathode region 24 before the potential of the gate region 20 is raised to the high potential level, then gate region 20 serves to collect electrons emitted at cathode region 24 before they can reach anode region 18. This serves to help interrupt conduction between anode region 18 and cathode region 24. The blocking (essentially nonconducting) state, is the OFF state. The geometry and impurity concentrations of structure 10 are designed to help inhibit or interrupt current flow between anode region 18 and cathode recion 24.

The voltage applied to semiconductor support 12 causes an electric field which extends through dielectric layer 14 and into semiconductor body 16. Normally, during the ON state, electrons coat the bottom of semiconductor body 16 and act to shield it from the effect of the positive bias applied to substrate 12. With structure 10 biased to the OFF state, these electrons are removed from the bottom of semiconductor body 16 and drawn into gate region 20. This field helps to cause the potential of the portion of the bulk portion of body 16 between gate region 20 and extending down to dielectric layer 14 to be greater in potential than anode region 18 and region 22 and cathode region 24. Ihe biased substrate 12 thus acts as a second or back gate which aids in switching structure 10 to the OFF state. Control circuitry capable of supplying the needed gate potentials and absorbing the electrons is illustrated and described in U.S. patent application Ser. No. 248,206, which is being filed concurrently with this application and which has a common assignee.

With semiconductor body 16 being of n− type conductivity, conduction from anode region 18 to cathode region 24 occurs if region 18 is forward-biased with respect to region 24 and the potential of gate region 20 is below a level which inhibits or interrupts conduction between anode region 18 and cathode region 24. During the ON state holes are injected into body 16 from anode region 18 and electrons are injected into body 16 from cathode region 24. These holes and electrons can be in sufficient numbers to form a plasma which conductivity modulates body 16. This effectively lowers the resistance of body 16 such that the resistance between anode region 18 and cathode region 24 is relatively low when structure 10 is operating in the ON state. This type of operation is denoted as dual carrier injection. Positively biased substrate 12 creates an electrical field which passes through the dielectric layer 14 and tends to deplete the bulk portion of body 16. Electrons emitted from cathode region 24 coat the bocttom of body 16 and thus act to shield the effect of the electrical field created by biased substrate 12. These electrons accumulate at the bottom of the bulk portion of body 16 which is adjacent to dielectric layer 14. This limits the effect of biased substrate 12 and thus allows conduction between anode region 18 and cathode region 24.

Region 22 helps limit the punch-through of a depletion layer formed during operation between gate region 20 and cathode region 24 and helps inhibit formation of a surface inversion layer between these two regions. In addition, it facilitates gate region 20 and cathode region 24 being relatively closely spaced apart. This facilitates relatively low resistance between anode region 18 and cathode region 24 during the ON state. It also serves to increase maximum operating voltage and to reduce leakage currents.

During the ON state of structure 10, the junction diode comprising anode region 18 and both semiconductor body 16 and gate region 20 can become forward-biased. Current limiting means (not illustrated) are normally included to limit the conduction through the forward-biased diode into the electrode 30. One example of such current limiting means is illustrated and described in U.S. patent application Ser. No. 248,206.

The ON state can be achieved by having the potential of the anode region 18 greater than that of the cathode region 24 and forward-biasing the anode region 18 with respect to the gate region 20. Typically, 1-10 microamperes are pulled out of the gate region 20 while the anode-gate junction is forward-biased to cause structure 10 to assume the ON state.

It is possible to operate structure 10 in the ON state with the potential of gate region 20 at the same or a more positive level than that of anode region 18, cathode region 24, and region 22, so long as the potential of gate region 20 is below a level which assures that the potential of a vertical cross-sectional portion of semiconductor body 16 between anode region 18 and cathode region 24 is more positive than the potentials of both anode region 18 and region 22. With the gate region 20 held at such a potential level, the junction diode comprising anode region 18 and both the semiconductor body 16 and gate region 20 has a zero forward bias or is reverse-biased.

One typical embodiment could have the following design. Support member 12 is an n type silicon substrate, 18 to 22 mils thick to provide mechanical support, with an impurity concentration of approximately $5 \times 10^{13}$ impurities/cm$^3$ corresponding to a resistivity of approximately 100 ohm-centimeters. The other dimensions are dictated by the size and number of bodies 16 to be included. Dielectric layer 14 is a silicon dioxide layer that is 2 to 4 microns thick. Body 16 is typically 30 to 55 microns thick, approximately 430 microns long, 300 microns wide, and is of n− type conductivity with an impurity concentration in the range of approximately $5-9 \times 10^{13}$ inpurities/cm$^3$. Anode region 18 is of p+ type conductivity, is typically 2 to 4 micron thick, 44 microns wide, 52 microns long, and has an impurity concentration of approximately $10^{19}$ impurities/cm$^3$ or larger. Electrode 28 is typically aluminum, with a thickness of 1½ microns, a width of 84 microns, and a length of 105 microns. Region 20 is of n+ type conductivity and is typically 2 to 20 microns thick, 15 microns wide, 300 microns long, and has an impurity concentration of approximately $10^{19}$ impurities/cm$^3$ or larger. Electrode 30 is aluminum, 1½ microns thick, 50 microns wide, and 340 microns long. The spacing between adjacent edges of electrodes 28 and 30 and between adjacent edges of electrodes 30 and 32 is typically 40 microns in both cases. Region 22 is p type conductivity and is typically 3-6 microns thick, 64 microns wide, 60 microns long, and has an impurity concentration of approximately $10^{17}$ to $10^{18}$ impurities/cm$^3$. Cathode region 24 is n+ type conductivity and is typically 2 microns thick, 48 microns wide, 44 microns long, and has an impurity concentration of approximately $10^{19}$ impurities/cm$^3$ or larger. Electrode 32 is aluminum, 1½ microns thick, 104 microns wide, and 104 microns long. The spacing between the ends of regions 18 and 22 and the respective ends of body 16 is typically 55 microns. The spacing between anode region 18 and gate region 20 is typically 74 microns as is the spacing between gate region 20 and region 22. Region 34 is n+ type conductivity and is typically 2 microns thick, 26 microns wide, 26 microns long, and has an impurity concentration of $10^{19}$ impurities/cm$^3$ or larger. Electrode 36 is aluminum which is 1½ microns thick, 26 microns wide, and 26 microns long.

It has been discovered that decreasing the impurity concentration of the bulk portion of semiconductor body 16 of structure 10 of FIG. 1 causes a modification in the mode of operation. Starting with the above design parameters, but with the impurity concentration of the bulk of semiccnductor body 16 at approximately $1 \times 10^{13}$ instead of $9 \times 10^{13}$ impurities/cm$^3$, it was found that with the potential of gate region 20 at approximately the same level as anode region 18, conduction between anode region 18 and cathode region 24 is inhibited or interrupted (cut off) except for a relatively low level flow. This is the OFF (high impedance) state. With a positive bias applied to anode region 18 relative to cathode region 24, and with gate region 20 allowed to essentially electrically float in potential, substantial current flow can exist between anode region 18 and cathode region 24. The relatively low level current flow of the OFF state helps aids in switching structure 10 to the ON state. Ihis is the ON (low impedance) state. Control circuitry useful to control the state of a structure 10 which has the operating characteristics described in this paragraph is described in U.S. patent application Ser. No. 248,206, which is being filed ccncurrently with the present application and which is a continuation-in-part of U.S. patent application Ser. No. 107,771, filed Dec. 28, 1979. Ser. No. 107,771, is in itself a continuation-in-part of U.S. patent application Ser. No. 972,023, abandoned June 24, 1980.

One major advantage of structure 10, which has a semiconductor body 16 whose impurity concentration is as described immediately hereinabove, is that the gate potential need only be at that of the anode potential to switch the structure to the OFF state. It is thus not necessary to use a higher potential than exists at the anode in order to operate structure 10. Many applications require high voltage and high current switches but the most positive potential available is that applied to one of the terminals of the switch. This embodiment of structure 10 can be used in such applications so long as a limited amount of current flow can be tolerated between the anode and cathode regions when structure 10 is in the OFF state.

Figure 2:
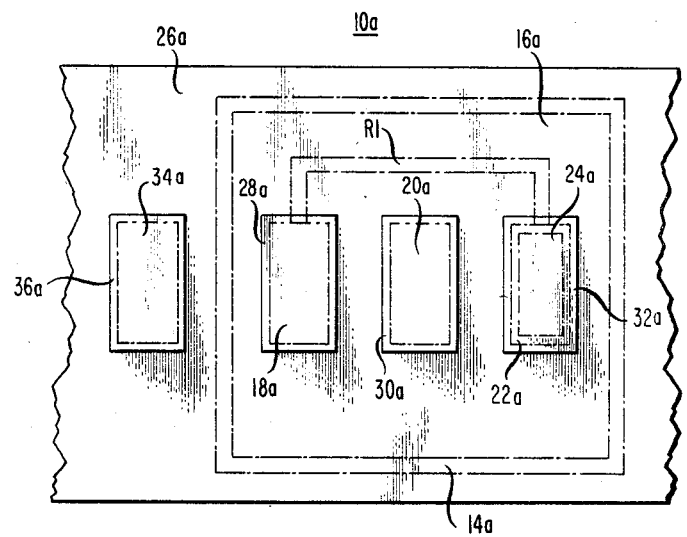
FIG. 2 illustrates another embodiment of a structure in accordance with the invention.

Referring now to FIG. 2, there is illustrated a structure 10a which is very similar to structure 10 of FIG. 1 and all components thereof which are essentially identical or similar to structure 10 are denoted with the same reference number with the addition of an "a". The basic difference between structures 10a and 10 is the existence of a resistive-type region R1 in structure 10a which couples anode region 18a to shield region 22a. The inclusion of region R1 allows structure 10a to be operated in the off state with the maximum needed gate potential being approximately equal to the anode potential and allows for a considerably wider variation in the impurity concentration of semiconductor region 16a than is possible if R1 is not utilized. R1 serves to provide a predictable high impedance path between anode region 18a and shield region 24a. Variations in the impurity concentration of semiconductor body 16a thus become less critical since a high impedance path is established between anode region 18a and shield region 22a and this path exists relatively independent of the impurity concentration of semiconductor body 16a. Typically, the impurity concentration of semiconductor body 16a is between $2 \times 10^{12}$ impurities/cm$^3$ and $2 \times 10^{13}$ impurities/cm$^3$. R1 can be ion implanted or diffused into semiconductor body 16a. A discrete resistor could be connected between anode electrode 28a and region 22a, if an electrode (not illustrated) is provided which is in contact with region 22a. This resistor would serve essentially the same purpose as R1. In a preferred embodiment, R1 is a ion implanted pinch type resistor and is of the same conductivity type as regions 18a and 22a. Region 22a can be eliminated in some applications. In this case R1 is extended so as to contact cathode region 24a or a discrete R1 could instead be connected to anode electrode 36a and to a p+ type contact region (not illustrated) within body 16a and located close to cathode region 24a.

The subject matter of this application bears certain similarities to that of our U.S. patent application Ser. Nos. 972,056 and 107,774, filed Dec. 20, 1978 and Dec. 28, 1979, respectively, and Ser. No. 248,192, being filed concurrently with this case, and all having a common assignee.

The embodiments described herein are intended to be illustrative of the general principles of the invention. Various modifications are possible consistent with the spirit of the invention. For example, support member 12 can alternatively be p type conductivity silicon, gallium arsenide, sapphire, a conductor, or an electrically inactive material. If support member 12 is an electrically inactive material, then insulator (dielectric) layer 14 can be eliminated. Still further, body 16 can be fabricated as an air isolated type structure. This allows for the elimination of support member 12. Further, the electrodes can be doped polysilicon, gold, titanium, or other types of conductors. Still further, the impurity concentration levels, spacings between different regions, and other dimensions of the regions can be adjusted to allow significantly different operating voltages and currents than are described. Additionally, other types of (dielectric) materials, such as silicon nitride, or Semi-Insulating Polycrystalline Oxygen Doped Silicon (SIPOS) can be substituted for silicon dioxide. Still further, two structures of the present invention with common gate terminals and the anode of each coupled to the cathode of the other allow alternating or direct current operation. Still further, a single semiconductor substrate can contain some semiconductor bodies which are p type conductivity and others which are of n type conductivity. Still further, in some applications, portions of region 22 (22a) could be extended to meet gate region 20 (20a). Still further, the conductivity type of all regions within the dielectric layer can be reversed provided the voltage polarities are appropriately changed in the manner well known in the art. Still further, an electrical contact can be made to region 22. Dependent on the resistivity of region 22, the electrical contact thereto could be made directly to region 22 or through a p+ type semiconductor contact region added into a portion of region 22. Region 22 could then be used as a second gate region of structure 10. It is to be appreciated that the combination of two of the structures of the present invention with the cathode of each coupled to the anode of the other and the gates being common provides a bidirectional switch which allows alternating or direct current operation. Still further a semiconductor layer of the same conductivity type as gate region 20(20a) of FIG. 1 (2) can be sandwiched in between semiconductor body 16(16a) and dielectric layer 14(14a). Typically this added layer is electrically connected to gate electrode 30(30a). This layer can be a layer which completely separates semiconductor body 16(16a) from dielectric layer 14(14a), or can be a layer which only partly separates same. Such layers are described in more detail in U.S. patent application Ser. No. 248,305 which is being filed concurrently with the present application and in which there is a common assignee. Still further, a single semiconductor substrate can contain some semiconductor bodies which are of p− type conductivity and others which are of n− type conductivity.

What is claimed is:

1. A switching element comprising a semiconductor body whose bulk is of one conductivity type and relatively high resistivity and which includes anode, gate, and cathode regions spaced apart and localized along a common planar surface of the body, each being of relatively low resistivity, a shield region being of higher resistivity than the anode region and surrounding the cathode region so as to separate it from the bulk portion of the semiconductor body, the cathode and gate regions being of the same conductivity type as the bulk and the anode and shield regions being of the opposite conductivity type as the bulk, and separate cathode, anode, and gate electrode, the gate region being located essentially directly between the anode and shield regions, the parameters of the various portions of the switching element being such that with the potential of the anode region being forward biased with respect to the cathode region and the potential of the gate region being insufficient to essentially completely deplete a cross-sectional portion of the bulk of the semiconductor body between the anode and cathode regions there is facilitated a substantial current flow between the anode and cathode regions via the bulk, and with the anode region being forward biased with respect to the cathode region and the potential of the gate region being of sufficiently greater magnitude than that of the anode region to essentially completely deplete a cross-sectional portion of the bulk of the semiconductor body between the anode and cathode regions and to cause this portion of the bulk of the semiconductor body to be at a potential which is greater in magnitude than exists at the anode, cathode and shield regions, there is facilitated an inhibiting or interrupting (cutting off) of current flow between the anode and cathode regions.

2. A plurality of switching elements in accordance with claim 1 with each included in a common semiconductor support member and dielectrically isolated from one another.

3. A pair of switching elements each in accordance with claim 1 or claim 2 with the gate electrodes of the pair connected to one another and the anode electrode of each connected to the cathode electrode of the other to provide a bilateral switch.

4. A switching element comprising a semiconductor body whose bulk is of one conductivity type and relatively high resistivity and which includes anode, gate, and cathode regions spaced apart and localized along a common planar surface of the body, each being of relatively low resistivity, a shield region being of intermediate resistivity between the anode region and the bulk portion of the semiconductor body and surrounding the cathode region so as to separate it from the bulk portion of the semiconductor body, the cathode and gate regions being of the same conductivity type as the bulk and the anode and shield regions, being of the opposite conductivity type as the bulk, and separate cathode, anode, and gate electrodes, the gate region being located essentially directly between the first and fourth regions, the semiconductor body being separated from a semiconductor support member by a dielectric layer, the semiconductor support member having a separate electrode coupled thereto which is adapted to be held at the most positive potential used with the switching element if the gate region is of n type conductivity, and at the most negative potential used with the switching element if the gate region is of p type conductivity, the parameters of the various portions of the structure being such that with the potential of the anode region being forward biased with respect to the cathode region and the potential of the gate region being insufficient to deplete a cross-sectional portion of the bulk of the semiconductor body between the anode and cathode regions there is facilitated a substantial current flow between the anode and cathode regions via the bulk, and with the potential of the anode region being forward biasad with respect to the cathode region and the potential of the gate region being of a sufficient magnitule relative to the anode region to deplete the portion of the bulk of the semiconductor body between the anode and cathode regions and to cause this portion of the bulk of the semiconductor body to be at a potential which is greater in magnitude than exists at the anode, cathode and shield regions, there is facilitated an inhibiting or interrupting (cutting off) of current flow between the anode and cathode regions.

* * * * *